United States Patent
Oka

(10) Patent No.: US 8,331,103 B2
(45) Date of Patent: Dec. 11, 2012

(54) WIRING BOARD, METHOD OF MANUFACTURING SAME, TUNER MODULE, AND ELECTRONIC DEVICE

(75) Inventor: Shuichi Oka, Kanagawa (JP)

(73) Assignee: Sony Corporation, Tokyo (JP)

( * ) Notice: Subject to any disclaimer, the term of this patent is extended or adjusted under 35 U.S.C. 154(b) by 304 days.

(21) Appl. No.: 12/688,490

(22) Filed: Jan. 15, 2010

(65) Prior Publication Data
US 2010/0208439 A1 Aug. 19, 2010

(30) Foreign Application Priority Data
Feb. 19, 2009 (JP) .................................. 2009-036081

(51) Int. Cl.
*H05K 1/16* (2006.01)
(52) U.S. Cl. ........ 361/765; 361/760; 361/761; 361/777; 361/821; 336/200; 336/232
(58) Field of Classification Search .................. 361/760, 361/761–763, 765, 777, 268, 821; 336/200, 336/232
See application file for complete search history.

(56) References Cited

U.S. PATENT DOCUMENTS

| 770,432 | A * | 9/1904 | Kinraide | 336/182 |
| 6,169,470 | B1 * | 1/2001 | Ibata et al. | 336/83 |
| 6,201,287 | B1 * | 3/2001 | Forbes | 257/528 |
| 7,141,883 | B2 * | 11/2006 | Wei et al. | 257/778 |
| 2004/0044382 | A1 * | 3/2004 | Ibrahim | 607/60 |
| 2004/0127036 | A1 * | 7/2004 | Ahn et al. | 438/689 |
| 2006/0170071 | A1 * | 8/2006 | Imaoka et al. | 257/531 |
| 2006/0249810 | A1 * | 11/2006 | Lee et al. | 257/531 |
| 2009/0128436 | A1 * | 5/2009 | Guo et al. | 343/772 |

FOREIGN PATENT DOCUMENTS
JP 05-235554 9/1993

* cited by examiner

*Primary Examiner* — Hoa C Nguyen
(74) *Attorney, Agent, or Firm* — Robert J. Depke; Rockey, Depke & Lyons, LLC

(57) ABSTRACT

Disclosed herein is a wiring board including: a shield layer; and n layers (n is an integer of two or more) of inductor wiring formed above the shield layer and forming an inductor; wherein of the n layers of inductor wiring, the inductor wiring closest to the shield layer has a smallest wiring area.

7 Claims, 5 Drawing Sheets

WIRING BOARD, METHOD OF MANUFACTURING SAME, TUNER MODULE, AND ELECTRONIC DEVICE

The present application claims priority to Japanese Patent Application JP 2009-036081 filed in the Japanese Patent Office on Feb. 19, 2009, the entire content of which is hereby incorporated by reference.

BACKGROUND OF THE INVENTION

1. Field of the Invention

The present invention relates to a wiring board including an inductor, a method of manufacturing the same, a tuner module, and an electronic device.

2. Description of the Related Art

Silicon tuners achieving a function of receiving television broadcasts with an analog high-frequency circuit integrated in a semiconductor such as Si (silicon), SiGe (silicon germanium) or the like have recently been actively developed. Silicon tuners have a feature of a greatly reduced volume as compared with box-type modules of "CAN tuners" in the past. CAN tuners have a large volume because not only an IC (Integrated Circuit) of a mixer, a PLL (Phase Locked Loop) circuit and the like but also a large number of analog parts including an air-core coil having a diameter of a few mm which air-core coil forms an analog section such as a filter or the like and a varactor diode are mounted within a metal for shielding.

Silicon tuners realize miniaturization by integrating these analog parts into an IC. However, when a filter function is integrated into an IC, it is difficult to enhance the performance of a filter as compared with CAN tuners because a coil that can be integrated into an IC has a small diameter of a few μm. Thus, in employing a silicon tuner, it is difficult to enhance receiving sensitivity because of a difficulty in sufficiently removing an undesired signal by a filter.

Accordingly, a method is known which enhances receiving sensitivity by mounting a winding inductor as an external part on a board separately from a silicon tuner (IC). However, when the external part is mounted on a printed wiring board or an interposer board, a wire bond and board wiring have to be routed from the silicon tuner and connected for electric connection between the silicon tuner and the external part. Thus, inductor characteristics are degraded due to effects of parasitic resistance, parasitic capacitance, and parasitic inductance of the wiring and the like. In addition, costs such as the parts cost of the external part, a mounting cost and the like are added to the cost of the tuner.

As one of techniques for solving such problems, a technique is known which forms the coil of an inductor by wiring of a printed wiring board or an interposer board. This technique can substantially shorten a distance of routing of wiring, and suppress degradation in inductor characteristic due to parasitic resistance and parasitic inductance. However, this technique has problems of increasing parasitic capacitance between the wiring and other wiring in the board and decreasing the self resonance frequency of the inductor.

Accordingly, for example Japanese Patent No. 2898814 (referred to as Patent Document 1 hereinafter) describes a constitution as a constitution of a "multilayer wiring board with a printed inductor" in which a part or all of a ground layer, a wiring layer, or a power supply layer situated directly below or directly above a printed inductor included in the multilayer wiring board is cut away. This constitution equivalently increases a distance between the ground layer, the wiring layer, or the power supply layer and the printed inductor by the presence of the cutaway part. Thereby, the parasitic capacitance of the inductor is reduced, and a decrease in the self resonance frequency of the inductor is prevented.

SUMMARY OF THE INVENTION

However, there has been a recent trend for the printed wiring board or the interposer board to be rapidly decreased in thickness (plate thickness). Thus, a reduction in parasitic capacitance to suppress the decrease in the self resonance frequency sufficiently cannot be expected by merely cutting away wiring above or below the inductor included in the printed wiring board.

It is desirable to provide a technique that can improve frequency characteristics of an inductor included in a wiring board by further reduction in parasitic capacitance.

A wiring board according to an embodiment of the present invention includes: a shield layer; and n layers (n is an integer of two or more) of inductor wiring formed above the shield layer and forming an inductor; wherein of the n layers of inductor wiring, the inductor wiring closest to the shield layer has a smallest wiring area.

The wiring board according to the above-described embodiment of the present invention reduces parasitic capacitance interposed between the inductor wiring closest to the shield layer and the shield layer as compared with a case where the inductor wiring closest to the shield layer has a wiring area equal to the wiring area of the other inductor wiring.

According to the present embodiments, by minimizing the wiring area of the inductor wiring closest to the shield layer, the parasitic capacitance interposed between the inductor wiring and the shield layer can be reduced. Thus, the frequency characteristics of the inductor included in the wiring board can be improved.

DETAILED DESCRIPTION OF THE PREFERRED EMBODIMENTS

<1. First Embodiment>

[Constitution of Tuner Module]

Figure 1A:
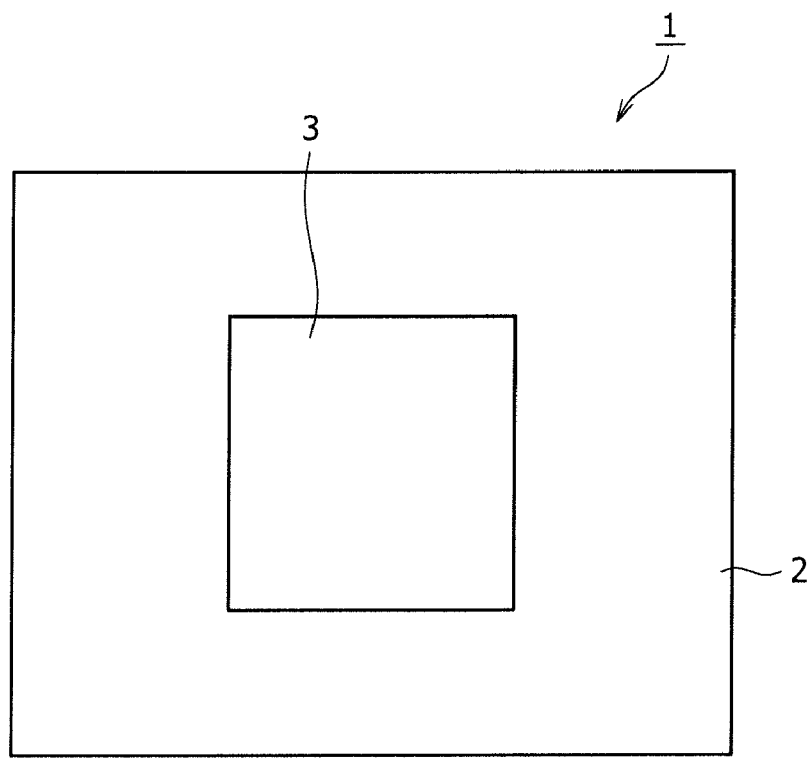
FIGS. 1A and 1B show general constitutions of a tuner module according to an embodiment of the present invention, FIG. 1A being a plan view, and FIG. 1B being a side view.
Figure 1B:
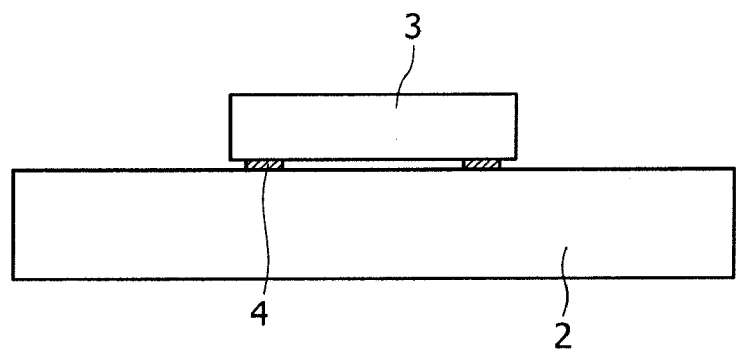

FIGS. 1A and 1B show a general constitution of a tuner module according to an embodiment of the present invention. FIG. 1A is a plan view, and FIG. 1B is a side view. As shown in FIGS. 1A and 1B, the tuner module 1 includes a wiring board 2 and a tuner element 3. The wiring board 2 is formed by using a multilayer wiring board having a plurality of wiring layers. The wiring board 2 includes an inductor (to be described later in detail). The tuner element 3 includes an IC (chip) having a tuner function. The tuner element 3 is mounted on the wiring board 2. The wiring board 2 and the tuner element 3 are electrically and mechanically connected to each other by a connecting part 4.

[Constitution of Wiring Board]

Figure 2:
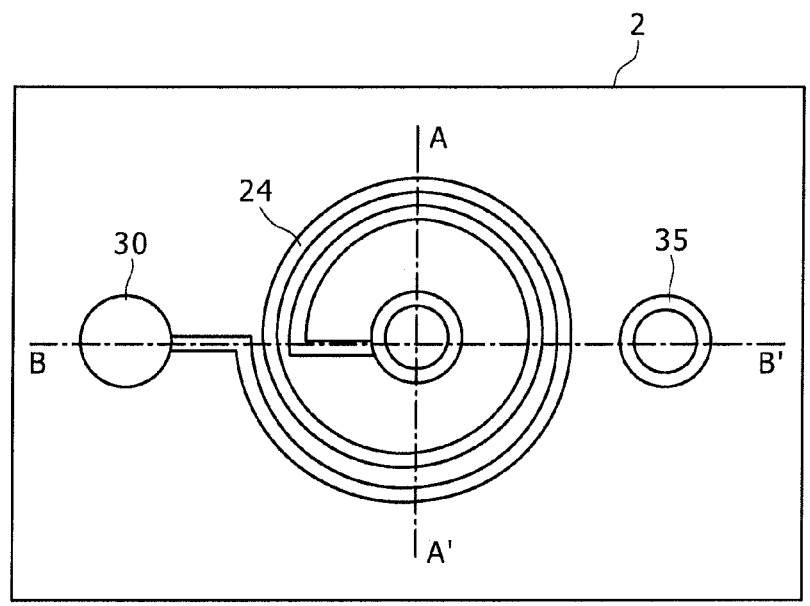
FIG. 2 is a plan view of a constitution of a wiring board according to a first embodiment of the present invention.
Figure 3:
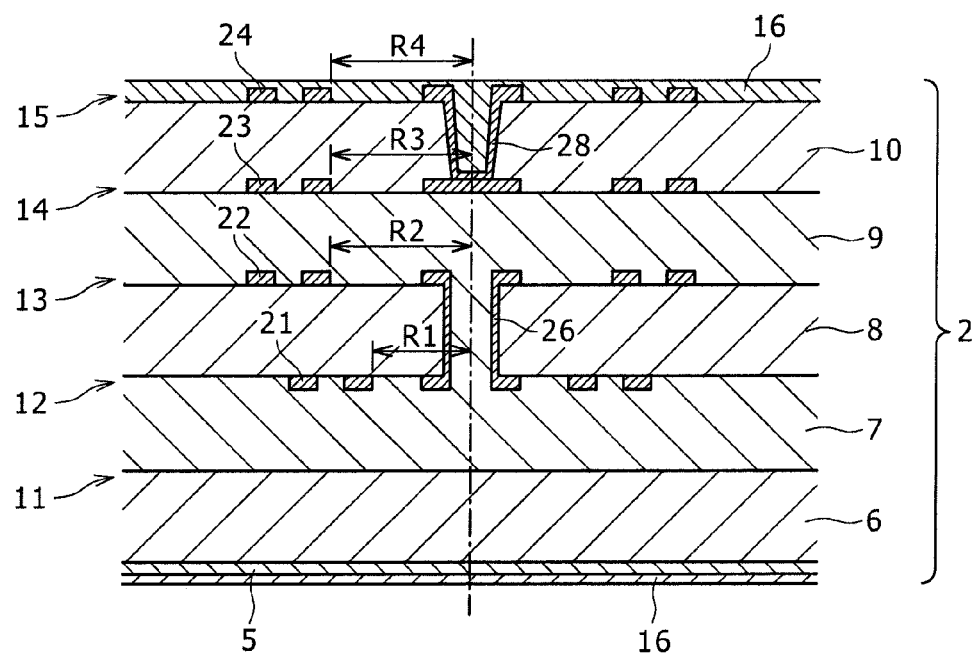
FIG. 3 is a sectional view taken along a line A-A' of FIG. 2.
Figure 4:
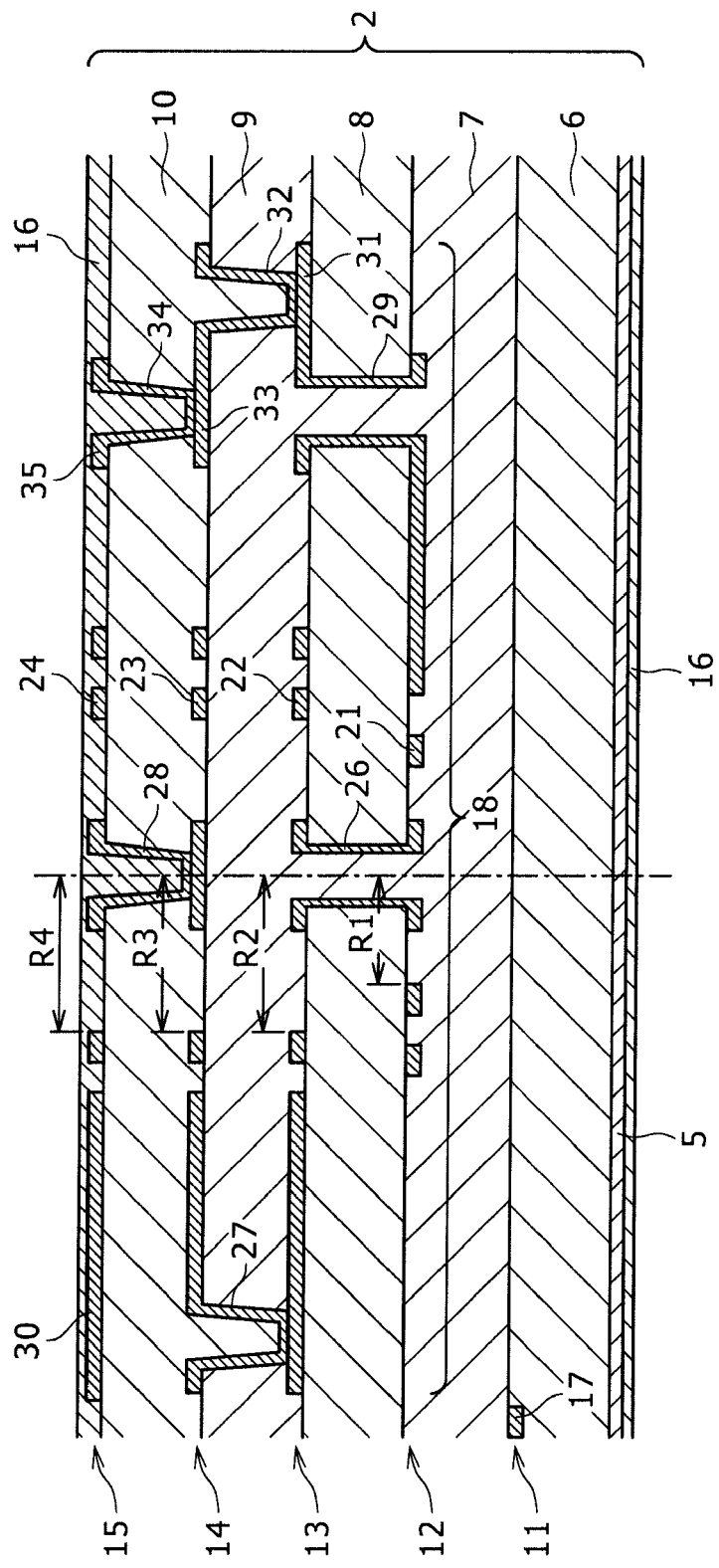
FIG. 4 is a sectional view taken along a line B-B' of FIG. 2.

FIG. 2 is a plan view of a constitution of a wiring board according to a first embodiment of the present invention. FIG. 3 is a sectional view taken along a line A-A' of FIG. 2. FIG. 4 is a sectional view taken along a line B-B' of FIG. 2.

As shown in the figures, a shield layer 5 is formed as an underlayer of the wiring board 2. When the tuner module 1 is mounted on a motherboard not shown in the figure, the shield layer 5 exerts an effect of an electric shield between the tuner module 1 and the motherboard. The shield layer 5 is formed by a conductive material such as a metal (for example, copper) or the like. The shield layer 5 is formed in the entire surface of the wiring board 2, or selectively formed in a part that may need the electric shielding effect. The part that may need the electric shielding effect includes a region where inductor wiring is formed (which region will hereinafter be described also as an inductor wiring forming region). Thus, the shield layer 5 is formed so as to be larger than the plane area of the inductor wiring forming region at least below the inductor wiring forming region.

A first insulating layer 6, a second insulating layer 7, a third insulating layer 8, a fourth insulating layer 9, and a fifth insulating layer 10 are formed in a state of being laminated in order on the shield layer 5. In addition, a first wiring layer 11, a second wiring layer 12, a third wiring layer 13, a fourth wiring layer 14, and a fifth wiring layer 15 are provided above the shield layer 5. Each of the insulating layers 6, 7, 8, 9, and 10 is formed by an insulating material such as a resin or the like (for example a glass epoxy material). Each of the wiring layers 11, 12, 13, 14, and 15 is formed by a conductive material such as a metal or the like (for example copper).

The shield layer 5 is disposed as a lowermost layer of the wiring board 2. The fifth wiring layer 15 is disposed as an uppermost layer of the wiring board 2. The shield layer 5 and the fifth wiring layer 15 are each covered by a protective film 16. The protective film 16 is formed using a solder resist, for example.

The first wiring layer 11 is formed between the first insulating layer 6 and the second insulating layer 7. The second wiring layer 12 is formed between the second insulating layer 7 and the third insulating layer 8. The third wiring layer 13 is formed between the third insulating layer 8 and the fourth insulating layer 9. The fourth wiring layer 14 is formed between the fourth insulating layer 9 and the fifth insulating layer 10. The fifth wiring layer 15 is formed as an uppermost wiring layer on the upper surface of the fifth insulating layer 10. Wiring 17 is formed in the first wiring layer 11. The wiring 17 is cut away below the inductor wiring forming region 18 secured within the wiring board 2. Thus, wiring other than the inductor is not present but the insulating layers 6 and 7 are interposed between the inductor wiring forming region 18 and the shield layer 5.

[Constitution of Inductor]

The wiring board 2 includes four layers of inductor wiring 21, 22, 23, and 24 formed above the shield layer 5. These pieces of inductor wiring 21, 22, 23, and 24 are electrically connected in series with each other, thereby forming one inductor (coil). The pieces of inductor wiring 21, 22, 23, and 24 are formed in the inductor wiring forming region 18. The inductor wiring 21 is formed in the second wiring layer 12. The inductor wiring 22 is formed in the third wiring layer 13. The inductor wiring 23 is formed in the fourth wiring layer 14. The inductor wiring 24 is formed in the fifth wiring layer 15. The inductor wiring 21 and the inductor wiring 22 are electrically connected to each other through a via 26. The via 26 is formed in a state of penetrating through the third insulating layer 8. The via 26 is provided in a central part of a coil part (winding part) of the inductor. The inductor wiring 22 and the inductor wiring 23 are electrically connected to each other through a via 27. The via 27 is formed in a state of penetrating through the fourth insulating layer 9. The via 27 is provided on the outside of the coil part of the inductor. The inductor wiring 23 and the inductor wiring 24 are electrically connected to each other through a via 28. The via 28 is formed in a state of penetrating through the fifth insulating layer 10. As with the via 26, the via 28 is provided in the central part of the coil part of the inductor.

The pieces of inductor wiring 21, 22, 23, and 24 are formed in the shape of a round spiral in the corresponding wiring layers 12, 13, 14, and 15, respectively, so as to be in a same winding direction as viewed in planes. The number of turns of each of the pieces of inductor wiring 21, 22, 23, and 24 is set at "2." The number of turns of the inductor wiring can be changed arbitrarily. One end of the inductor wiring 21 is connected to a lower end of a via 29. The via 29 is formed in a state of penetrating through the third insulating layer 8. The via 29 is provided on the outside of the coil part of the inductor. Another end of the inductor wiring 21 is connected to a lower end of the via 26. One end of the inductor wiring 22 is connected to an upper end of the via 26. Another end of the inductor wiring 22 is connected to a lower end of the via 27. One end of the inductor wiring 23 is connected to an upper end of the via 27. Another end of the inductor wiring 23 is connected to a lower end of the via 28. One end of the inductor wiring 24 is connected to an upper end of the via 28. Another end of the inductor wiring 24 is connected to a terminal part 30. The terminal part 30 is formed on the upper surface of the fifth insulating layer 10 together with the inductor wiring 24. The terminal part 30 forms one terminal part of the inductor. The terminal part 30 is provided on the outside of the coil part of the inductor. Incidentally, while the via 27 is formed directly below the terminal part 30 in this case, positional relation between the via 27 and the terminal part 30 may be set such that the via 27 and the terminal part 30 are shifted from each other in a circumferential direction.

On the other hand, an upper end part of the via 29 is connected to a lower end part of a via 32 through lead wiring 31. The lead wiring 31 is formed as a part of the third wiring layer 13 on the upper surface of the third insulating layer 8 together with the inductor wiring 22. The via 32 is formed in a state of penetrating through the fourth insulating layer 9. As with the via 29, the via 32 is provided on the outside of the coil part of the inductor. An upper end part of the via 32 is connected to a lower end part of a via 34 through lead wiring 33. The lead wiring 33 is formed as a part of the fourth wiring layer 14 on the upper surface of the fourth insulating layer 9 together with the inductor wiring 23. The via 34 is formed in a state of penetrating through the fifth insulating layer 10. As with the vias 29 and 32, the via 34 is provided on the outside of the coil part of the inductor. In addition, a terminal part 35 is formed at an upper end part of the via 34. The terminal part 35 forms another terminal part of the inductor. The terminal part 35 is provided on the outside of the coil part of the inductor. The terminal part 35 is disposed on an opposite side from the terminal part 30 with the center of the coil part of the inductor interposed between the terminal part 35 and the terminal part 30.

When the air-core size of each of the pieces of inductor wiring 21, 22, 23, and 24 is defined as a distance (radius) from the center of the coil part of the inductor to an innermost circumferential part of each of the pieces of inductor wiring, the air-core size R1 of the inductor wiring 21 is set smaller than the air-core sizes R2, R3, and R4 of the other inductor wiring 22, 23, and 24. The air-core sizes R2, R3, and R4 of the inductor wiring 22, 23, and 24 are all set to be the same size. Thus, of the four layers of inductor wiring 21, 22, 23, and 24 forming the inductor, the inductor wiring 21 closest to the shield layer 5 has a smallest wiring area.

[Method of Manufacturing Wiring Board]

The wiring board 2 formed of the above constitution is manufactured by using a buildup method, for example. In this case, first, hole making processing (drill processing and the like), plating processing, and wiring processing are performed in order on a plate-shaped base material formed of a third insulating layer 8, a second wiring layer 12, and a third wiring layer 13. Thereby, the second wiring layer 12 (including inductor wiring 21), the third wiring layer 13 (including inductor wiring 22 and lead wiring 31), and vias 26 and 29 are formed. Thereby a core board is obtained. At this time, the air-core size R1 of the inductor wiring 21 is made smaller than the air-core size R2 of the inductor wiring 22 so that the wiring area of the inductor wiring 21 is smaller than the wiring area of the inductor wiring 22.

Next, a second insulating layer 7 and a wiring layer 11 are pressed onto the front surface of the core board (third insulating layer 8), and a fourth insulating layer 9 and a wiring layer 14 are pressed onto the back surface of the core board (third insulating layer 8). Thereafter, hole making processing (laser processing and the like) is performed on the second insulating layer 7 and the wiring layer 11, and hole making processing (laser processing and the like) is performed on the fourth insulating layer 9 and the wiring layer 14. Thereafter plating processing is performed to thereby form vias 27 and 32. Further, wiring processing is performed on the wiring layer 11 (including wiring 17) and the wiring layer 14 (including inductor wiring 23 and lead wiring 33). At this time, the air-core size R3 of the inductor wiring 23 is made to be the same as the air-core size R2 of the inductor wiring 22 so that the wiring area of the inductor wiring 23 is equal to the wiring area of the inductor wiring 22. Incidentally, either of the first wiring layer 11 and the fourth wiring layer 14 may be formed first, or the first wiring layer 11 and the fourth wiring layer 14 may be formed simultaneously.

Next, a first insulating layer 6 and a shield layer 5 are pressed onto the front surface of the second insulating layer 7, and a fifth insulating layer 10 and a wiring layer 15 are pressed onto the back surface of the fourth insulating layer 9. Thereafter, hole making processing (laser processing and the like) is performed on the first insulating layer 6 and the shield layer 5, and hole making processing (laser processing and the like) is performed on the fifth insulating layer 10 and the wiring layer 15. Thereafter plating processing is performed to thereby form vias 28 and 34. Further, wiring processing is performed on the shield layer 5 and the wiring layer 15 (including inductor wiring 24 and terminal parts 30 and 35). At this time, the air-core size R4 of the inductor wiring 24 is made to be the same as the air-core size R3 of the inductor wiring 23 so that the wiring area of the inductor wiring 24 is equal to the wiring area of the inductor wiring 23. Incidentally, either of the shield layer 5 and the fifth wiring layer 15 may be formed first, or the shield layer 5 and the fifth wiring layer 15 may be formed simultaneously. Thereafter, a protective film 16 is formed so as to cover the shield layer 5 and the fifth wiring layer 15. The wiring board 2 is completed after the above processes.

In the wiring board 2 having the inductor of the above constitution, when a current flows from one terminal part 30 of the inductor to the other terminal part 35, for example, the current follows a path as follows. First, the current flows from one terminal part 30 of the inductor through the inductor wiring 24 to the via 28. The current next flows through the inductor wiring 23 to the via 27. The current next flows through the inductor wiring 22 to the via 26. The current next flows through the inductor wiring 21 to the via 29. The current next flows through the lead wiring 31 to the via 32. The current next flows through the lead wiring 33 to the via 34, and reaches the other terminal part 35. When a current flows from the terminal part 35 of the inductor to the terminal part 30, the current flows through the reverse of this path.

Figure 5:
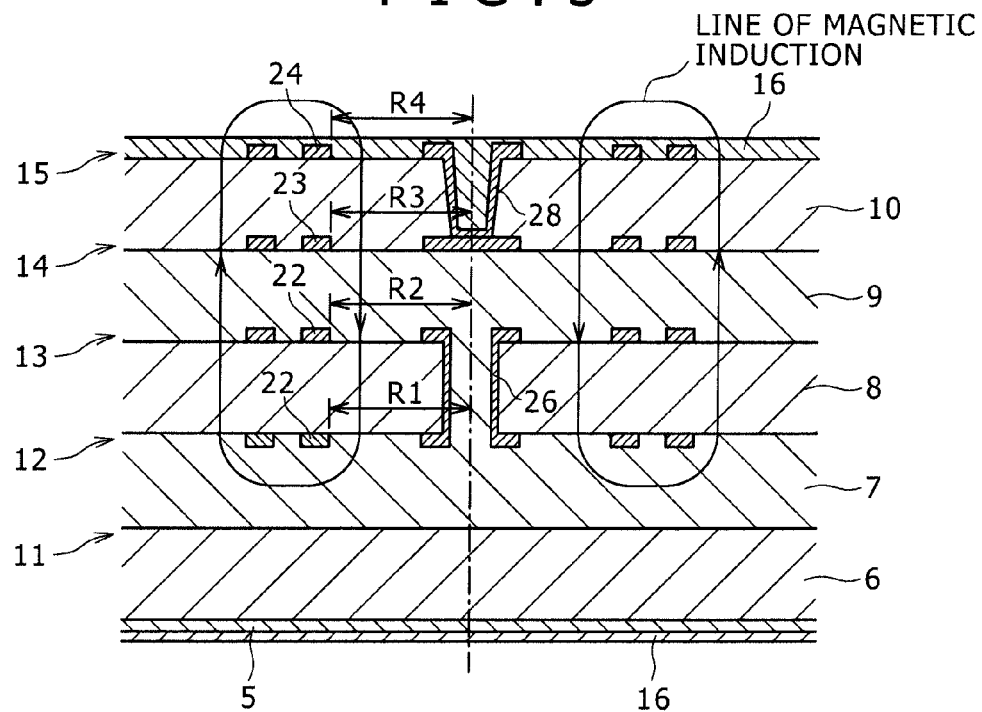
FIG. 5 is a sectional view of a constitution of a comparative example.

At this time, minimizing the wiring area of the inductor wiring 21 closest to the shield layer 5 provides the following action and effects, as compared with a case where the inductor wiring 21 has a wiring area equal to the wiring area of the other inductor wiring 22, 23, and 24 as shown in FIG. 5. Because an area of the inductor wiring 21 which area is opposed to the shield layer 5 is reduced, a parasitic capacitance interposed between the shield layer 5 and the inductor wiring 21 is reduced. Therefore the self resonance frequency of the inductor can be increased by the reduction in parasitic capacitance. In addition, of the four layers of inductor wiring 21, 22, 23, and 24, the inductor wiring 21 in the lowermost layer most affects the parasitic capacitance occurring between the shield layer 5 and the inductor wiring 21. Thus, decreasing the wiring area of the inductor wiring 21 contributes to reduction in the parasitic capacitance more greatly than decreasing the wiring area of the other inductor wiring 22, 23, and 24.

<2. Second Embodiment>

[Constitution of Wiring Board]

Figure 6:
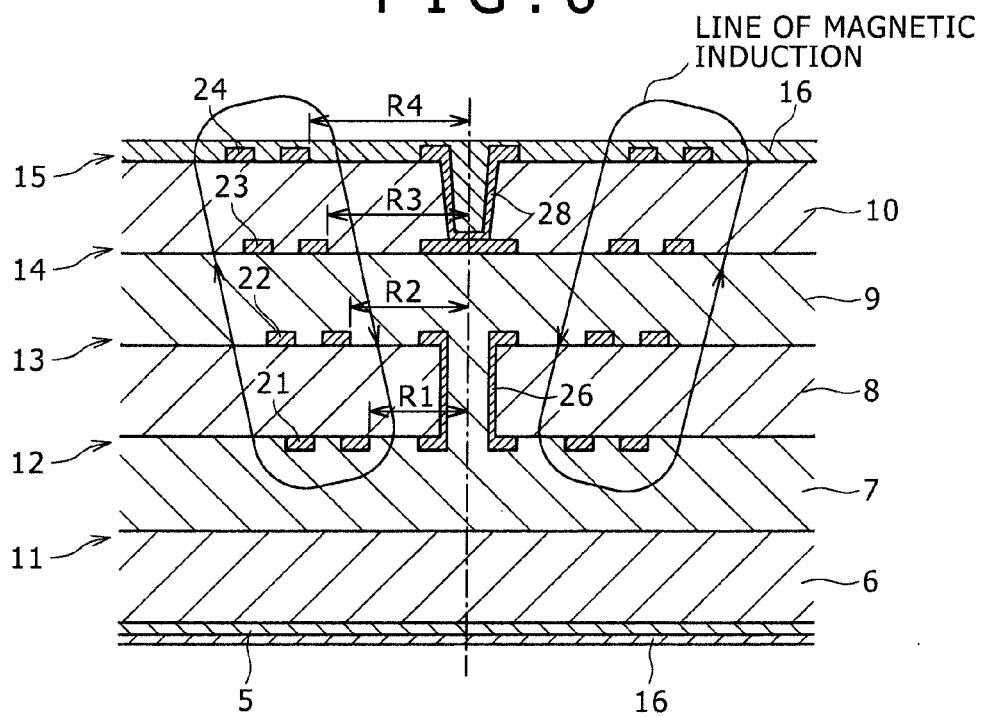
FIG. 6 is a sectional view of a constitution of a wiring board according to a second embodiment of the present invention.

FIG. 6 is a sectional view of a constitution of a wiring board according to a second embodiment of the present invention. The constitution of the wiring board 2 in FIG. 6 has commonalities with that of the foregoing first embodiment in that four layers of inductor wiring 21, 22, 23, and 24 form one inductor and in that the inductor wiring 21 closest to a shield layer 5 has a smallest wiring area. However, the second embodiment is different from the foregoing first embodiment in relation between the air-core sizes R1, R2, R3, and R4 of the respective pieces of inductor wiring 21, 22, 23, and 24.

Specifically, the air-core size R2 of the inductor wiring 22 is set larger than the air-core size R1 of the inductor wiring 21. The air-core size R3 of the inductor wiring 23 is set larger than the air-core size R2 of the inductor wiring 22. The air-core size R4 of the inductor wiring 24 is set larger than the air-core size R3 of the inductor wiring 23. That is, the air-core sizes R1, R2, R3, and R4 of the four layers of inductor wiring 21, 22, 23, and 24 are set in a relation R1<R2<R3<R4 so as to increase gradually as distance from the shield layer 5 is increased.

When the air-core sizes R1, R2, R3, and R4 of the respective pieces of inductor wiring 21, 22, 23, and 24 are thus set, and a current flows between terminal parts 30 and 35 of the inductor, lines of magnetic induction are formed in an obliquely inclined state with respect to the shield layer 5 parallel with the board surface of the wiring board 2. On the other hand, in the comparative example shown in FIG. 5 described above, lines of magnetic induction are formed in a vertically upright state with respect to the shield layer 5. Thus, a long effective distance of lines of magnetic induction from the inductor wiring 21 to the shield layer 5 can be secured without the fundamental structure of the inductor being changed. Thus, in addition to similar effects to those of the foregoing first embodiment, a decrease in inductance (L) value due to an eddy-current loss can be suppressed.

Incidentally, while the number of layers of inductor wiring is four in each of the foregoing embodiments, the present invention is not limited to this. The number of layers of inductor wiring may be two or three, or may be five or more.

In addition, while the air-core size R1 of the inductor wiring 21 is set at a minimum to minimize the wiring area of the inductor wiring 21 closest to the shield layer 5 in each of the foregoing embodiments, the present invention is not limited to this. For example, the wiring area of the inductor wiring 21 may be minimized by making the inductor wiring 21 closest to the shield layer 5 have a narrowest wiring width.

<3. Example of Application>

Figure 7:
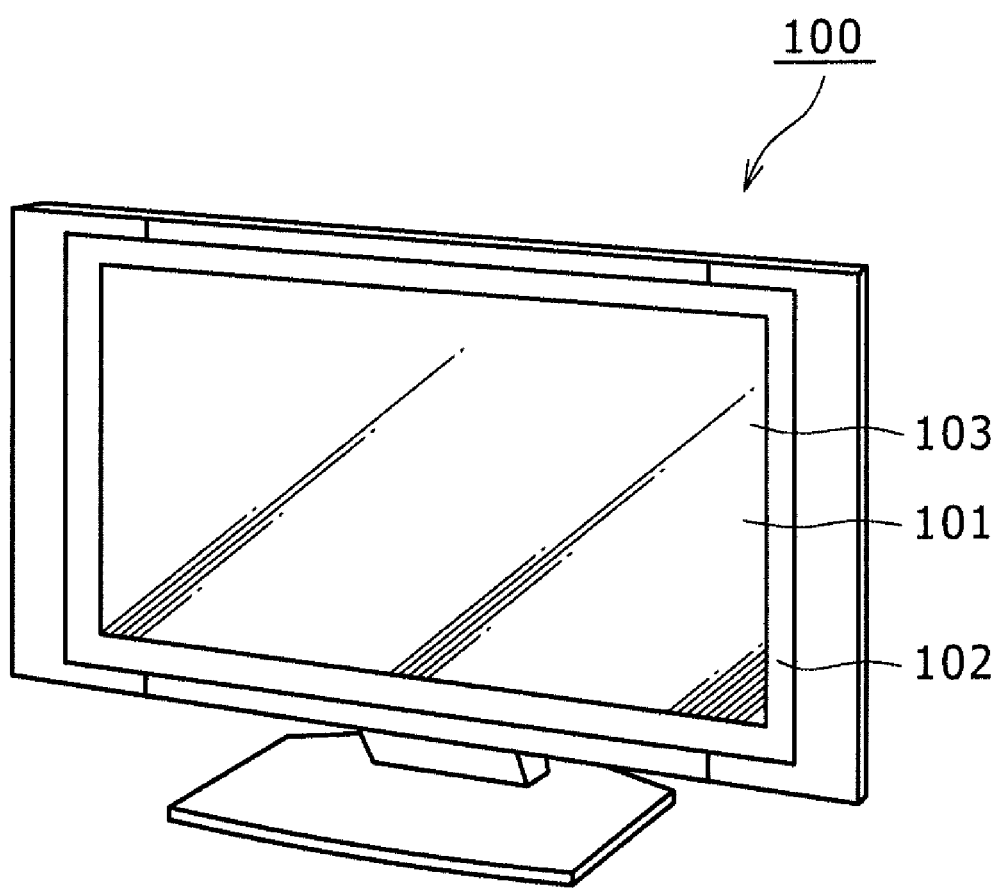
FIG. 7 is a perspective view of an example of an electronic device to which the present invention is applied.

The present invention is widely applicable to electronic devices receiving broadcast radio waves using a tuner module. An example of the electronic devices to which the present invention is applied is a television receiver 100 having a video display screen section 101 composed of a front panel 102, a filter glass 103 and the like as shown in FIG. 7, for example. In this example of application, the above-described tuner module 1 is included in the television receiver 100 as a final set product. Thus, the television receiver 100 having excellent receiving sensitivity can be realized.

The present application contains subject matter related to that disclosed in Japanese Priority Patent Application JP 2009-036081 filed in the Japan Patent Office on Feb. 19, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A wiring board comprising;
   a shield layer; and
   n layers (n is an integer of two or more) of inductor wiring formed above said shield layer forming an inductor;
   wherein of said n layers of inductor wiring, the inductor wiring closest to said shield layer has a smallest wiring area for an innermost wiring coil portion and each subsequent layer has at least one coil portion formed to overlap at least a coil portion of a layer formed directly beneath.

2. The wiring board according to claim 1,
   wherein the inductor wiring closest to said shield layer has a smallest air-core size.

3. The wiring board according to claim 2,
   wherein air-core size of said n layers of inductor wiring is set so as to increase gradually as distance from said shield layer is increased.

4. The wiring board according to claim 1,
   wherein the inductor wiring closest to said shield layer has a narrowest wiring width.

5. A tuner module comprising:
   a wiring board including a shield layer and n layers (n is an integer of two or more) of inductor wiring formed above said shield layer and forming an inductor; and
   a tuner element mounted on said wiring board in a state of being electrically connected to said n layers of inductor wiring wherein of said n layers of inductor wiring, the inductor wiring closest to said shield layer has a smallest wiring area for an innermost wiring coil portion and each subsequent layer has at least one coil portion formed to overlap at least a coil portion of a layer formed directly beneath.

6. An electronic device using a tuner module comprising:
   a wiring board including a shield layer and n layers (n is an integer of two or more) of inductor wiring formed above said shield layer and forming an inductor; and
   a tuner element mounted on said wiring board in a state of being electrically connected to said n layers of inductor wiring, wherein of said n layers of inductor wiring, the inductor wiring closest to said shield layer has a smallest wiring area for an innermost wiring coil portion and each subsequent layer has at least one coil portion formed to overlap at least a coil portion of a layer formed directly beneath.

7. A method of manufacturing a wiring board, said method comprising:
   when manufacturing the wiring board including a shield layer and n layers (n is an integer of two or more) of inductor wiring formed above said shield layer and forming an inductor,
   forming said n layers of inductor wiring such that the inductor wiring closest to said shield layer has a smallest wiring area for an innermost wiring coil portion and each subsequent layer has at least one coil portion formed to overlap at least a coil portion of a layer formed directly beneath.

* * * * *